United States Patent
Morales et al.

(10) Patent No.: US 10,371,764 B2
(45) Date of Patent: Aug. 6, 2019

(54) ALL-OPTICAL AND ISOTROPIC MAGNETOMETER

(71) Applicant: Commissariat A L'Energie Atomique et aux Energies Alternatives, Paris (FR)

(72) Inventors: Sophie Morales, Varces (FR); Mathieu Baicry, Sassenage (FR); Francois Bertrand, Seyssins (FR); Matthieu Le Prado, Saint-Marcellin (FR); Jean-Michel Leger, Villard Bonnot (FR); Umberto Rossini, Coublevie (FR); Jaroslaw Rutkowski, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 347 days.

(21) Appl. No.: 15/204,230

(22) Filed: Jul. 7, 2016

(65) Prior Publication Data
US 2017/0010337 A1   Jan. 12, 2017

(30) Foreign Application Priority Data
Jul. 8, 2015   (FR) ...................... 15 56485

(51) Int. Cl.
*G01R 33/26*   (2006.01)

(52) U.S. Cl.
CPC .................... *G01R 33/26* (2013.01)

(58) Field of Classification Search
CPC ...... G01R 33/26; G01R 33/032; G01R 33/24; G01R 33/02; G01R 33/0041; G01N 24/006
See application file for complete search history.

(56) References Cited

U.S. PATENT DOCUMENTS

| | | | | |
|---|---|---|---|---|
| 5,357,199 A | * | 10/1994 | Leger ..................... | G01R 33/26 324/300 |
| 5,534,776 A | * | 7/1996 | Leger ..................... | G01R 33/26 324/301 |

(Continued)

FOREIGN PATENT DOCUMENTS

| | | |
|---|---|---|
| EP | 0 579 537 B1 | 10/1997 |
| EP | 0 656 545 B1 | 1/2002 |

(Continued)

OTHER PUBLICATIONS

English translation of WO 2013/092383 provided by Espacenet.*
(Continued)

*Primary Examiner* — Rishi R Patel
(74) *Attorney, Agent, or Firm* — Oblon, McClelland, Maier & Neustadt, L.L.P.

(57) ABSTRACT

An optical pumping and isotropic measurement magnetometer. The magnetometer is all-optical in the sense that resonance between Zeeman sub-levels is induced by modulating the intensity or the frequency of the pump beam. Resonance is detected either using the pump beam itself or an unmodulated probe beam. The pump beam is linearly polarised and its polarisation direction is kept constant relative to the direction of the magnetic field to be measured, so that a measurement independent of the orientation of the field can be made.

19 Claims, 4 Drawing Sheets

(56) References Cited

U.S. PATENT DOCUMENTS

| | | | |
|---|---|---|---|
| 8,587,304 B2* | 11/2013 | Budker | G01R 33/26 324/304 |
| 2010/0156419 A1* | 6/2010 | Sugioka | G01R 33/26 324/318 |
| 2015/0022200 A1* | 1/2015 | Ichihara | G01R 33/26 324/304 |
| 2015/0054504 A1* | 2/2015 | Ichihara | G01R 33/26 324/305 |
| 2016/0061913 A1* | 3/2016 | Kobayashi | G01R 33/26 324/305 |

FOREIGN PATENT DOCUMENTS

| | | | |
|---|---|---|---|
| FR | 2 984 519 A1 | | 6/2013 |
| FR | 2 984 519 B1 | | 2/2014 |
| WO | WO 2013092383 A1 * | 6/2013 | G01R 33/26 |

OTHER PUBLICATIONS

French Preliminary Search Report dated May 18, 2016 in French Application 15 56485, filed on Jul. 8, 2015 ( with English translation of Categories of Cited Documents).

J. Rutkowski et al "Towards a miniature atomic scalar magnetometer using a liquid crystal polarization rotator", Sensors and Actuators A: Physical, vol. 216, 2014, 8 pages.

W. Gawlik et al "Nonlinear magneto-optical rotation with amplitude modulated light", Applied Physics Letters 88, 2006, 3 pages.

A. Cassimi et al. "$^4$He optical pumping with intensity modulated laser light", J. Phys II, vol. 1, No. 2, 1991, 11 pages.

Jun-Hai Zhang et al. "Realization and Optimization of all-optical Cs atom Magnetometer based on Bell-Bloom structure", Journal of Optoelectronics Laser, vol. 26, No. 2, 2015, 6 pages ( with English Abstract).

* cited by examiner

ALL-OPTICAL AND ISOTROPIC MAGNETOMETER

TECHNICAL DOMAIN

This invention relates to the domain of optical pumping magnetometers in general.

STATE Of PRIOR ART

Optimum pumping magnetometers have been known for several decades. They are based on magnetic resonance between Zeeman sub-levels, amplified by optical pumping. For example, in a magnetometer of this type using a helium ($^4$He) cell, helium atoms at the $1^1S_0$ level are excited to the $2^3S_1$ metastable level by means of an HF discharge. This $2^3S_1$ metastable level is divided into a Zeeman triplet in the presence of a static magnetic field. Atoms at the $2^3S_1$ level are optically pumped to the $2^3P_0$ level by means of a tunable laser. The result is different depletion of the different sub-levels of the triplet, by selective excitation at the $2^3P_0$ level. The atoms thus excited return to the $2^3S_1$ metastable level by spontaneous emission. Magnetic resonance between levels of the triplet is induced by means of an RF field at the Larmor frequency. The amplitude of the resonance signal is amplified by optical pumping. Resonance is observed by means of a laser beam absorption peak at the exit from the cell. In practice, the RF field generator is slaved in frequency on the absorption peak by means of a PLL loop, and the modulus of the magnetic field is deduced directly from the resonant frequency F starting from the relation Larmor $B_0=(2\pi/\gamma)F$ in which $\gamma$ is the gyromagnetic ratio of the electron. Such a magnetometer measuring the modulus of the magnetic field is called a scalar magnetometer in the literature.

In practice, optical pumping magnetometers are strongly anisotropic. Fading of measurement signals occurs for some orientations of the sensor relative to the direction of the magnetic field to be measured.

Different solutions have been proposed to compensate for this measurement anisotropy.

Patent EP-B-579537 issued by the applicant of this invention describes an optical pumping magnetometer comprising a cell filled with helium, a laser emitting a beam at a wave length tuned to the energy difference between the $2^3P_0$ and $2^3S_1$ levels of $^4$He (line D0), a polariser to linearly polarise the beam before it is injected into the cell and a photodetector receiving the beam that has passed through the cell. The magnetometer also includes a discharge circuit that changes helium atoms from the $1^1S_0$ fundamental level to the $2^3S_1$ metastable level by means of an electrostatic discharge between two electrodes placed on the cell. Finally, an RF frequency generator supplies power to two coils with orthogonal axes surrounding the cell so as to generate an RF magnetic field within the cell. The axes of the two coils and the beam propagation direction are chosen to form a right-angled trihedron.

In this magnetometer, measurement anisotropy is overcome by slaving firstly the polarisation direction of the beam and secondly the direction of the RF magnetic field such that they are both in the plane orthogonal to the magnetic field to be measured. The polarisation direction is slaved by means of a synchronous detection at the Larmor frequency.

A first variant of this magnetometer was described in patent EP-B-656545 also in the name of this applicant. According to this variant, the linear polariser and the RF coils are mechanically fixed such that the polarisation direction is always parallel to the direction of the RF magnetic field. The assembly consisting of the polariser and the RF coils is rotated by a non-magnetic motor, slaving in rotation being achieved by synchronous detection at the Larmor frequency.

A second variant of this magnetometer was described in patent FR-B-2984519. This second variant has the advantage that is does not require any rotating parts or an angular position encoder, the polarisation direction of the pump beam being slaved by means of a liquid crystal polarisation rotator and the direction of the RF magnetic field being controlled by supplying power to induction coils.

Although remarkable developments have been made, there are still some disadvantages with optical pumping magnetometers according to prior art.

Firstly, it is necessary to control the direction of the RF field so that it is perpendicular to the external magnetic field to be measured. Control of the field direction requires either the use of complex mechanical systems with an angular encoder, or additional calculations have to be carried out to obtain power supply currents in the RF coils.

Furthermore, the use of an RF field to observe resonance very much complicates networking of magnetometers, since the RF field generated by a magnetometer can disturb the measurement made by another magnetometer if they are close to each other (problem of crosstalk between nearby magnetometers).

Consequently, the purpose of this invention is to disclose an optical pumping magnetometer does not have the above-mentioned disadvantages. In particular, this invention discloses the manufacture of a simple and robust isotropic optical pumping magnetometer that does not require control of the RF field and that can be networked.

PRESENTATION OF THE INVENTION

This invention is defined by an optical pumping magnetometer comprising a cell filled with a gas, a laser source emitting a laser beam, a polarisation module adapted to linearly polarise the laser beam and to rotate the polarisation such that the laser beam is polarised in a polarisation direction, a photodetector receiving the polarised laser beam after it has passed through the cell and outputting an electrical signal, first slaving means to keep a constant angle between the polarisation direction and a magnetic field to be measured, said magnetometer also including modulation means to modulate at least a first part of the laser beam so as to generate a pump beam modulated by a modulation frequency ($f_m$) and second slaving means to keep said modulation frequency equal to the Larmor frequency of the gas or one of its harmonics, the value of the magnetic field to be measured being obtained from said modulation frequency.

According to a first embodiment, the modulation means make an intensity modulation at the Larmor frequency and at twice this frequency.

In a first variant, the photodetector receives the pump beam and the electrical signal resulting from conversion of the pump beam by the photodetector is output to the first and second slaving means.

In a second variant, the magnetometer comprises an optical separator on the input side of the polarisation module to form a first part and a second part of the laser beam, the pump beam (P) being obtained by modulating the first part of the laser beam by said modulation means, the second part of the laser beam forming a probe beam (S) not modulated by said modulation means, the electrical signal resulting from conversion of the probe beam being input to the first and to the second slaving means.

According to a first configuration, the probe beam and the pump beam are parallel and are separated by a distance less than the diffusion length of gas atoms in the cell.

In a second configuration, the probe beam and the pump beam intersect in the cell at an angle significantly less than 90°, and preferably less than 10° or even 5°.

The first slaving means advantageously perform a demodulation at the Larmor frequency.

The second slaving means preferably perform an amplitude detection on the peak of the DC line, the anti-symmetric error signal being obtained by a demodulation at a harmonic of a second modulation frequency ($f_{mod\_BF}$) superposed on the modulation frequency ($f_m$).

The modulation means may be composed of an acousto-optic modulator. Alternatively, they may be composed of an electro-optic modulator.

When the laser source is a laser diode, the magnetometer may include third slaving means receiving said electrical signal and controlling the power supply current and/or the temperature of the laser diode such that the wavelength of the laser beam is constant.

According to a second embodiment, the modulation means make a frequency modulation at the Larmor frequency.

The modulation means comprise for example an AC/DC coupler to superpose a modulation current on the laser power supply current.

The first slaving means advantageously perform a demodulation at the Larmor frequency.

The second slaving means preferably perform an amplitude detection on the peak of the DC line, the anti-symmetric error signal being obtained by demodulation at a harmonic of a second modulation frequency ($f_{mod\_BF}$) superposed on the modulation frequency ($f_m$).

When the laser source is a laser diode, the magnetometer may comprise third slaving means receiving said electrical signal and controlling the power supply current and/or the temperature such that the laser beam carrier frequency is constant.

BRIEF DESCRIPTION OF THE DRAWINGS

Other characteristics and advantages of the invention will become clear after reading a preferred embodiment of the invention with reference to the attached figures among which.

DETAILED PRESENTATION OF PARTICULAR EMBODIMENTS

The basic principle of this invention is to induce resonance between Zeeman sub-levels by optical means alone instead of using resonance induced by the RF field as in prior art.

According to a first embodiment of the invention, resonance is induced by modulating the intensity of the pump beam.

According to a second embodiment of the invention, resonance is induced by modulation of the wavelength of the pump beam.

Regardless of the embodiment, isotropy of the measurement is achieved by keeping the angle between the polarisation direction of the pump beam and the direction of the magnetic field to be measured constant.

Figure 1:
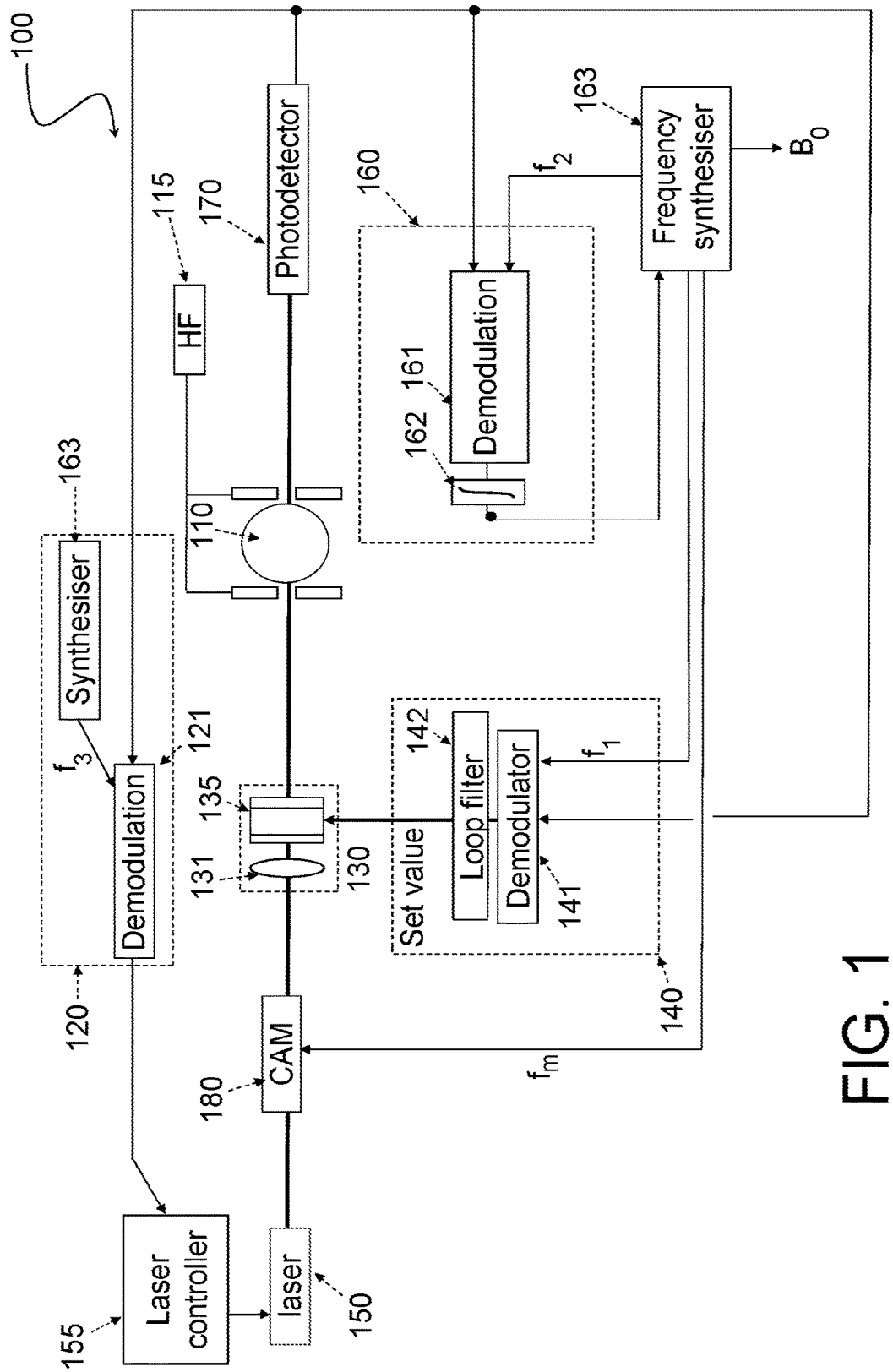
FIG. 1 diagrammatically represents an all-optical and isotropic magnetometer according to a first embodiment of the invention.

FIG. 1 diagrammatically shows a first embodiment of an isotropic all-optical embodiment according to a first embodiment of the invention.

This magnetometer 100 comprises a cell 110 filled with gas, for example helium or an alkaline gas. A gas for which the atoms have a zero nuclear spin (even number of nucleons) will be chosen in preference, the Larmor frequency then being directly proportional to the magnetic field to be measured. We will assume that the gas used is $^4$He in the remainder of this description for simplification reasons, without any loss of generality.

An HF discharge circuit 115 shifts atoms from the $1^1S_0$ fundamental level to the $2^3S_1$ metastable level by means of a high frequency discharge between two electrodes placed on opposite sides of the cell. The $2^3S_1$ metastable level is divided into a Zeeman triplet in the presence of the magnetic field $B_0$ to be measured.

A laser 150 emits a laser at a wavelength tuned to the energy difference between the $2^3P_0$ and $2^3S_1$ levels. An intensity modulation is applied to this beam, for example by means of an acousto-optic modulator or an electro-optic modulator, 180. The intensity of the beam thus modulated can be expressed in the following form:

$$I(t)=I_0(1+\varepsilon \sin(2\pi f_m t)) \quad (1)$$

where $I_0$ is the intensity of the unmodulated laser beam, $\varepsilon$ is the modulation depth and $f_m$ is the modulation frequency.

The beam thus modulated is then polarised by means of a polarisation module 130 composed of a linear polariser 131 and a nematic liquid crystal polarisation rotator 135. Alternatively, the polarisation module may include a linear polariser mounted on an orientable support controlled in rotation by a non-magnetic motor, for example a piezoelectric motor. Regardless of the method used to make the polarisation module, it can be used to orient the polarisation of the beam in any direction orthogonal to its propagation direction so as to keep the angle between the polarisation direction of the laser beam and the direction of the magnetic field constant, regardless of the sensor orientation.

The laser beam optically pumps from the $2^3S_1$ metastable level to the $2^3P_0$ excited level. The beam intensity modulation is made at a frequency $f_m$ equal to the Larmor frequency $$f_m = f_L = \frac{\omega_L}{2\pi} = \frac{\gamma}{2\pi} B_0$$

or to a harmonic of this frequency (for example $f_m = f_L/2$ or $f_m = 2f_L$). The intensity modulation of the laser beam at the Larmor frequency (or at a harmonic of this frequency) induces resonance between Zeeman sub-levels of the metastable level.

After having interacted with the cell gas, the laser beam is converted to an electrical signal by a photodetector, 170.

Resonance is demonstrated by a first demodulation module 140 to slave the polarisation direction of the laser beam perpendicular to the magnetic field $B_0$ and a second demodulation module 160 for slaving the modulation frequency of the optical intensity of the laser beam.

The first demodulation module 140 receives the signal output from the photodetector 170 and makes a demodulation at a first reference frequency $f_1$ output by the frequency synthesiser 163. The demodulator 141 is advantageously followed by a loop filter 142 that controls slaving. The signal demodulated by the demodulator 141 acts as an error signal to slave the polarisation direction on a set direction making a constant angle θ with the direction of the magnetic field $B_0$. In preference, θ will be chosen equal to 90°. The amplitude of the error signal is null when the polarisation direction is aligned on the set direction and is symmetric about the modulation frequency $f_m$.

The second demodulation module receives the signal output from the photodetector 170 and makes a demodulation at a second reference frequency $f_2$ output by the frequency synthesiser 163, to generate a measurement signal. The demodulator 161 is advantageously followed by a loop filter 162 (typically a low pass filter such as an integrator). This measurement signal is an anti-symmetric signal as a function of the modulation frequency $f_m$.

The result of the second demodulation/integration is a set value that controls generation of the modulation frequency $f_m$ by the frequency synthesiser 163. The set value is proportional to the Larmor frequency and can be converted to give the value of the magnetic field. The intensity of the magnetic field $B_0$ may be obtained from the set frequency of the frequency synthesiser 163 when its implementation is digital.

An example of an operating point of an isotropic all-optical magnetometer modulated in intensity is described below (corresponding to θ=90°).

The signal sent to the acousto-optic (or electro-optical) modulator 180 is equal to the sum of a modulation at $\omega_L$ and at $2\omega_L$ such that the intensity of the modulated optical beam can be written in the following form:

$$I(t)=I_0 [1+\varepsilon_1 \cos(2\pi f_L t)+\varepsilon_2 \cos(4\pi f_L t)] \qquad (2)$$

For control of the polarisation direction (module 140), demodulation consists of a synchronous detection between the signal output from the photodetector and the reference signal at frequency $f_1$. The signal of interest for the module 140 is the resonant signal at the Larmor frequency such that $f_1=f_L$.

For the measurement of the field $B_0$ and slaving of the modulation frequency $f_m$ (module 160), slaving is done on the peak of the DC resonant line and a low frequency RF $f_{mod\_BF}$ (typically 1kHz with modulation depth close to the width at mid-height of the line) is superposed on the modulation frequency $f_m$. The acousto-optic modulator makes a modulation at $f_{m\ [}1+A\cos(2\pi \cdot f_{mod_{BF}} \cdot t)]$. The low frequency modulation at $f_{mod\_BF}$ induces an amplitude modulation: an amplitude detection gives a signal that cancels out and changes sign at resonance. The anti-symmetric slaving signal that cancels out at resonance is obtained by a synchronous detection made at a harmonic of the frequency $f_{mod\_BF}$ ~1 kHz : therefore $f_2$ is equal to $f_{mod\_BF}$ or to a harmonic of $f_{mod\_BF}$.

Optionally, the magnetometer may be provided with a third demodulation module 120 capable of tuning the wavelength of the pump laser beam to line D0. The laser wavelength is modulated for this purpose at frequencies that do not induce resonance, for example $f_{mod\_laser}$ ~10 kHz. Several wavelength modulation types can be envisaged, direct modulation of the power supply current of the laser diode or the piezoelectric actuator or the electro-optic or acousto-optic wavelength (or phase) modulator. This third demodulation 120 receives firstly the signal output from the photodetector 170 and secondly a third reference signal at frequency $f_3=f_{mod\_laser}$ output from the frequency synthesiser 163 (the frequency synthesiser has been duplicated on the figure for display reasons). The result of this demodulation can be used to control the power supply current and/or the temperature of the laser diode 150 by means of a wavelength controller 155, so as to keep the laser wavelength constant.

Figure 2:
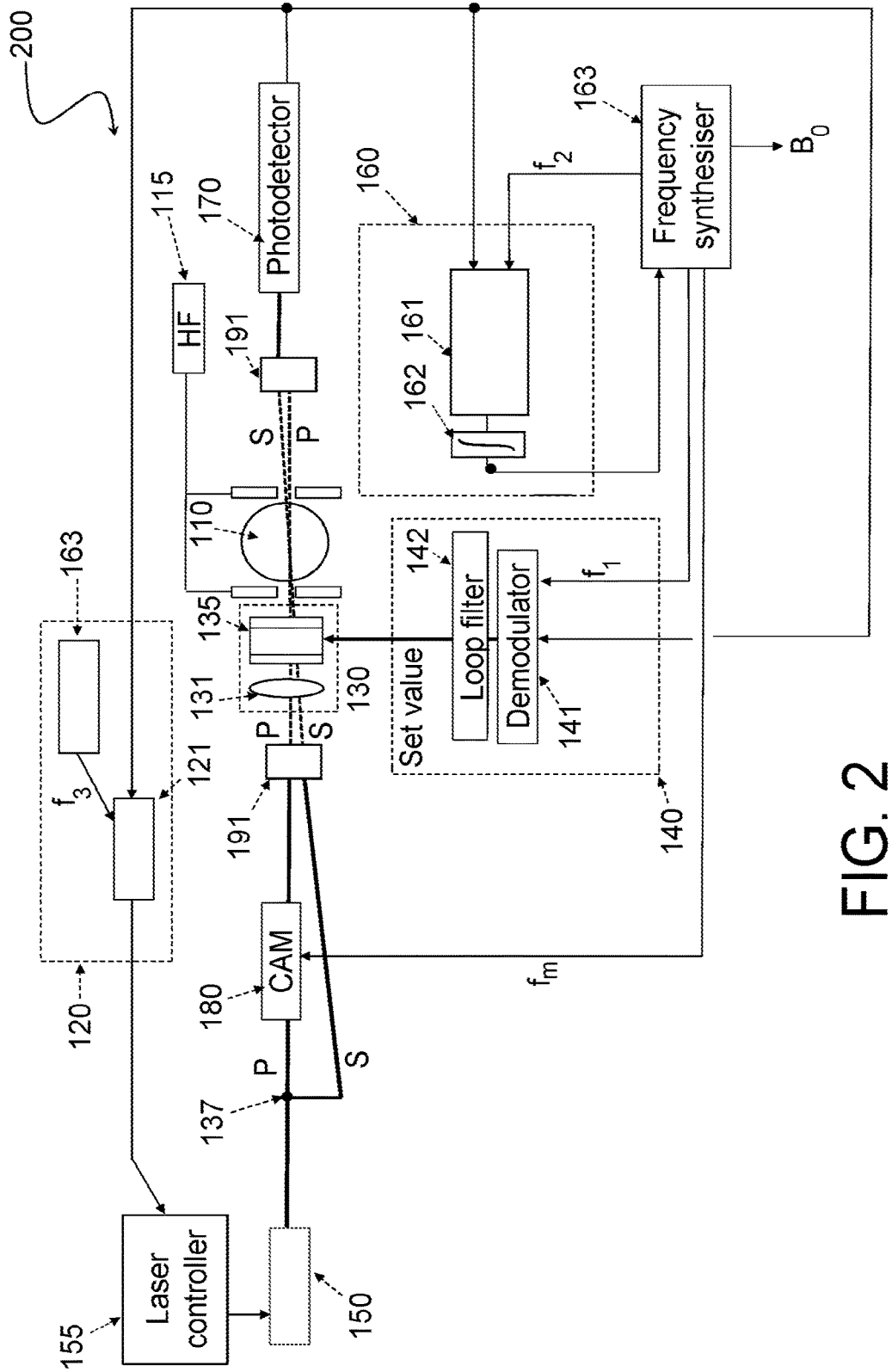
FIG. 2 diagrammatically represents an all-optical and isotropic magnetometer according to a variant of the first embodiment.

FIG. 2 diagrammatically shows an all-optical and isotropic magnetometer according to a variant of the first embodiment.

Elements identical to those shown in FIG. 1 have the same reference symbols.

Unlike the previous variant, the magnetometer 200 dissociates optical pumping and resonance measurement functions. More precisely, the beam emitted by the laser 150 is firstly divided by an optical coupler 137 into a pump beam P and a probe beam S.

The pump beam P is modulated by the intensity modulator 180 before being injected into the cell 110. As in the previous variant, the pump beam intensity modulation induces resonance between Zeeman sub-levels.

The probe beam makes it possible to detect resonance induced by the pump beam.

The pump beam P at the output from the intensity module 180 and the probe beam S are directed to the linear polariser 131 and the polarisation rotator 135 by means of optical fibres and optical collimators 191. The couple composed of the linear polariser 131 and the polarisation rotator may be replaced by a linear polariser mounted on an orientable support and driven in rotation by a non-magnetic motor.

According to a first embodiment, the probe beam passes through the zone pumped by the pump beam. More precisely, a low intersection angle (preferably between 0° and 40° and for example less than 10° or even 5°) between the pump and probe beams is then chosen so as to maximise overlap between the two beams.

According to a second embodiment (not illustrated), the pump and probe beams are chosen to be parallel and separated by a distance of less than the atom diffusion length (dependent on the gas pressure in the cell and the atom relaxation time).

Regardless of which example embodiment is used, after the probe beam has interacted with gas in the cell, it is converted into an electrical signal by photodetector 170. As in the embodiment in FIG. 1, a first demodulation may be applied to the signal output from the photodetector, in 140, to control the polarisation direction of the polariser, and a second demodulation 160 may be applied to control the intensity modulation frequency of the pump beam. Optionally, a third demodulation 120 may be performed to control the power supply current and/or the temperature of the laser diode depending on the chosen embodiment, so as to keep the laser wavelength constant.

The variant embodiment illustrated in FIG. 2 is advantageous in that demodulations are made from the probe laser and not from the modulated pump beam. This technique makes it possible to decouple modulation from the measurement of the resonance signal. Consequently detection of resonance is facilitated.

Figure 3:
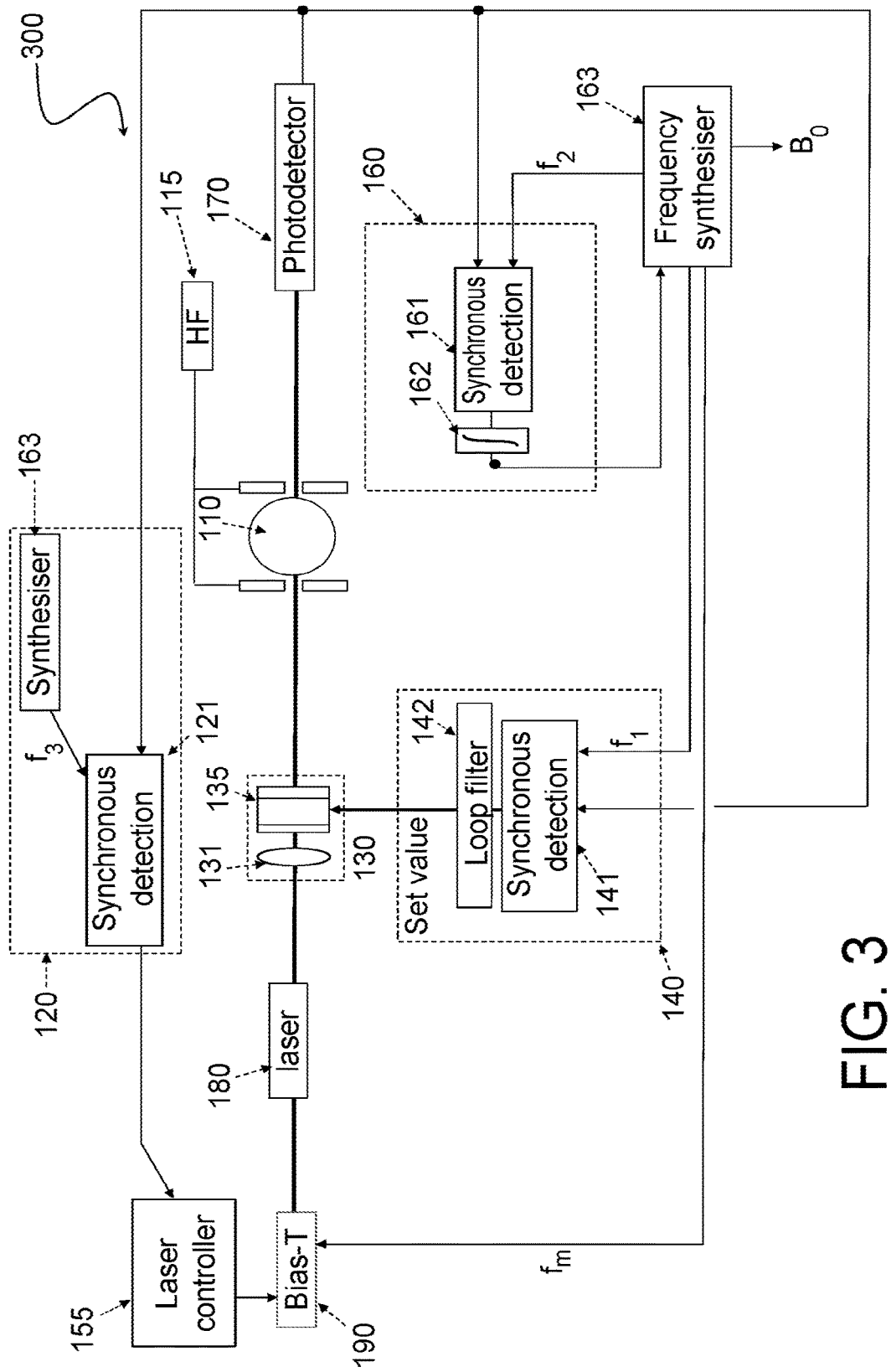
FIG. 3 diagrammatically represents an all-optical and isotropic magnetometer according to a second embodiment of the invention.

FIG. 3 diagrammatically shows an isotropic and all-optical magnetometer according to a second embodiment of the invention.

In this embodiment, resonance is induced by modulation of the pump beam wavelength. More precisely, the frequency of the pump beam is modified according to:

$$v(t) = v_0 + \Delta v_a + \frac{\Delta v_m}{2}\cos(2\pi f_m t) \quad (3)$$

where $v_0$ is the central frequency of the absorption line used for optical pumping (corresponding to the transition frequency between the $2^3S_1$ and $2^3P_0$ levels), $\Delta v_a$ is the shift between the carrier frequency and the central frequency of the absorption line, $\Delta v_m$ is the modulation depth and $f_m$ is the frequency of the frequency modulation. Advantageously, the modulation frequency is equal to the Larmor frequency, namely $f_m = f_L$ or one of its harmonics (for example $f_m = f_L/2$ or $f_m = 2f_L$).

Elements with the same reference symbols as those given in FIG. 1 or 2 are identical to elements already described. Unlike the first embodiment, the magnetometer 300 does not include an intensity modulator 180 (acousto-optic or electro-optic). The laser diode 150 is powered through an AC/DC coupler 190 that can be used to modulate the power supply current around a given operating point.

Figure 4:
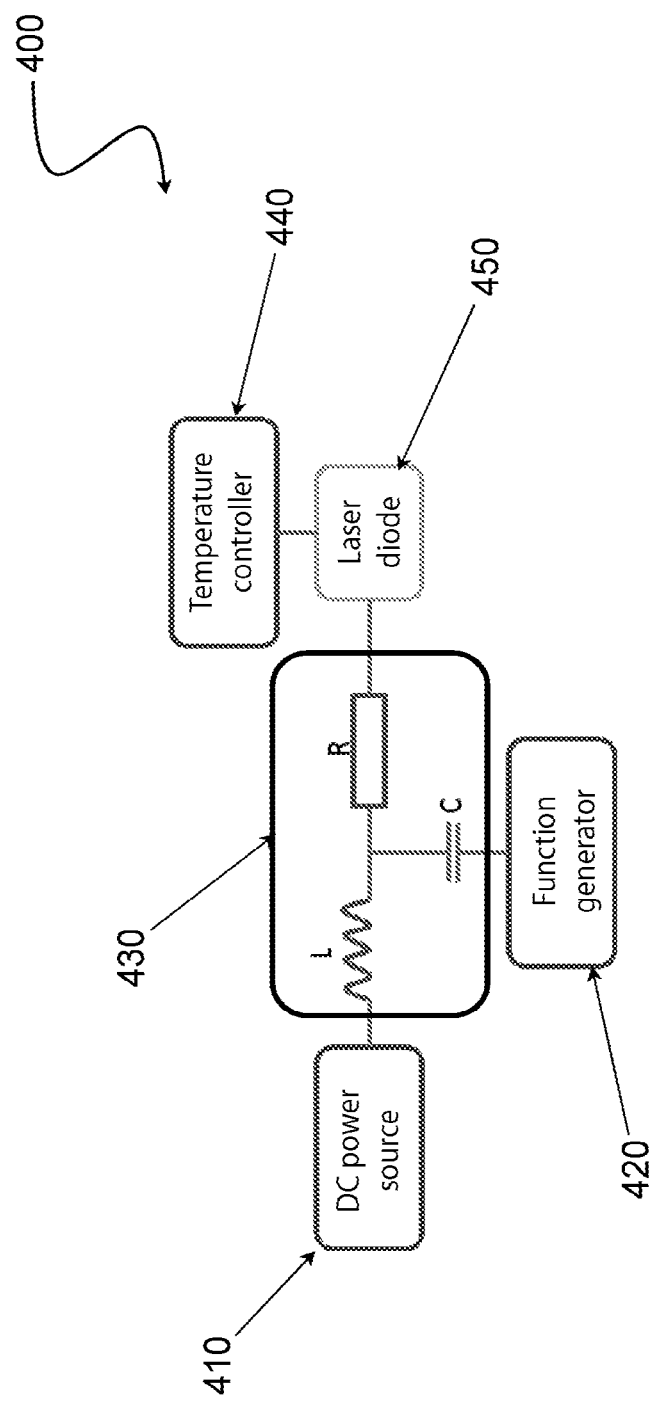
FIG. 4 represents an example of the laser wavelength modulation circuit in FIG. 3.

FIG. 4 shows an example of a power supply circuit for a laser diode 450. This circuit comprises a DC power supply current 410, a current generator 420 generating an AC current with a determined time function, an RLC circuit 430 acting as AC/DC coupler (bias-T), a temperature controller 440 and said laser diode 450. The current applied to the laser diode is nothing other than the sum of the DC current supplied by the source 410 and the AC current output by the generator 420. The current modulation passing through the laser diode induces a modulation of the wavelength of the laser diode. Thus, there is no need for an external modulator in the second embodiment.

As in the first embodiment, the magnetometer comprises a first demodulation module 140 to demodulate the signal output from the photodetector at a first reference frequency $f_1$. This demodulation slaves the polarisation direction of the laser beam by the polarisation rotator 135 so that it has a constant angle (preferably $\theta=90°$) with the magnetic field to be measured. As before, the couple composed of the linear polariser 131 and the polarisation rotator 135 can be replaced by a linear polariser mounted on an orientable support than can be driven in rotation by a non-magnetic motor.

The magnetometer also comprises a second demodulation module 160 to demodulate the signal output from the photodetector at a second reference frequency $f_2$. This demodulation makes it possible to slave the modulation frequency of the laser beam $f_m$ so as to create resonance between Zeeman sub-levels. Advantageously, the modulation frequency will be slaved to the Larmor frequency, namely $f_m = f_L$, and slaving of the polarisation direction by synchronous detection at $f_1 = f_L$ will be chosen (more specifically, the error signal to slave the laser beam polarisation direction is the resonance signal in quadrature detected at the Larmor frequency. This signal is symmetric as a function of the modulation frequency, and cancels out for angle $\theta=90°$ and is anti-symmetric at about $\theta=90°$). Furthermore, the measurement and slaving signal of the modulation frequency is the signal obtained by synchronous detection at $f_2 = 2*f_{mod_{BF}} \approx 2$ kHz. The resonance signal is the dc signal to which a low frequency modulation at $f_{mod\_BF}$ is added. Amplitude detection is used to obtain an error signal. The anti-symmetric signal that slaves the modulation frequency is the resonant signal on harmonic 2 of $f_{mod\_BF}$.

Optionally, as above, it would be possible to provide a third demodulation module 120 to slave the wave length of the laser diode through the laser controller 155, such that the carrier frequency $v_0 + \Delta v_a$ is kept at a constant value. A complementary modulation at $f_3 = f_{mod\_laser} \approx 10$ kHz could be superposed on the above modulations for this purpose.

The invention claimed is:

1. An optical pumping magnetometer comprising:
a cell filled with a gas;
a laser source emitting a laser beam;
a polarization module adapted to linearly polarize the laser beam and to rotate a polarization such that the laser beam is polarized in a polarization direction;
a photodetector receiving the polarized laser beam after the polarized laser beam has passed through the cell and outputting an electrical signal;
first slaving means to keep a constant angle between the polarization direction and a magnetic field to be measured, wherein the first slaving means includes modulation means to modulate at least a first part of the laser beam so as to generate a pump beam modulated by a modulation frequency ($f_m$), wherein the modulation means includes a beam intensity modulator that generates the pump beam and is disposed between the laser source and the polarization module;
second slaving means to keep said modulation frequency equal to a Larmor frequency of the gas or one of a plurality of harmonics of the Larmor frequency, a value of the magnetic field to be measured being obtained from said modulation frequency; and
a frequency synthesizer that generates the modulation frequency ($f_m$), based on a measurement signal generated by the second slaving means, and sends the modulation frequency ($f_m$) as feedback to the beam intensity modulator.

2. The optical pumping magnetometer according to claim 1, wherein the modulation means make an intensity modulation at the Larmor frequency and at twice a frequency of the Larmor frequency.

3. The optical pumping magnetometer according to claim 2, wherein the photodetector receives the pump beam and in that the electrical signal resulting from conversion of the pump beam by the photodetector is output to the first and second slaving means.

4. The optical pumping magnetometer according to claim 2, wherein the magnetometer comprises an optical separator on an input side of the polarization module to form a first part and a second part of the laser beam, the pump beam (P) being obtained by modulating the first part of the laser beam by said modulation means, the second part of the laser beam forming a probe beam (S) not modulated by said modulation means, the electrical signal resulting from conversion of the probe beam being input to the first and to the second slaving means.

5. The optical pumping magnetometer according to claim 4, wherein the probe beam and the pump beam are parallel and are separated by a distance less than a diffusion length of gas atoms in the cell.

6. The optical pumping magnetometer according to claim 4, wherein the probe beam and the pump beam intersect in the cell at an angle less than 90°.

7. The optical pumping magnetometer according to claim 1, wherein the first slaving means perform a demodulation at the Larmor frequency.

8. The optical pumping magnetometer according to claim 1, wherein the second slaving means perform an amplitude detection on the peak of a DC line, an anti-symmetric error signal being obtained by a demodulation at a harmonic of a second modulation frequency ($f_{mod\_BF}$) superposed on the modulation frequency ($f_m$).

9. The optical pumping magnetometer according to claim 2, wherein the modulation means are composed of an acousto-optic modulator.

10. The optical pumping magnetometer according to claim 2, wherein the modulation means are composed of an electro-optic modulator.

11. The optical pumping magnetometer according to claim 1, wherein the laser source is a laser diode that comprises third slaving means receiving said electrical signal and controlling a power supply current and/or a temperature of the laser diode such that a wavelength of the laser beam is constant.

12. The optical pumping magnetometer according to claim 1, wherein the modulation means make a frequency modulation at the Larmor frequency.

13. The optical pumping magnetometer according to claim 12, wherein the modulation means comprise an alternating current/direct current (AC/DC) AC/DC coupler to superpose a modulation current on a laser power supply current.

14. The optical pumping magnetometer according to claim 12, wherein the first slaving means perform a demodulation at the Larmor frequency.

15. The optical pumping magnetometer according to claim 12, wherein the second slaving means perform an amplitude detection on the peak of a DC line, an anti-symmetric error signal being obtained by demodulation at a harmonic of a second modulation frequency ($f_{mod\_BF}$) superposed on the modulation frequency ($f_m$).

16. The optical pumping magnetometer according to claim 12, wherein the laser source is a laser diode that comprises third slaving means receiving said electrical signal and controlling a power supply current and/or a temperature such that a laser beam carrier frequency is constant.

17. The optical pumping magnetometer according to claim 4, wherein the probe beam and the pump beam intersect in the cell at an angle less than 10°.

18. The optical pumping magnetometer according to claim 4, wherein the probe beam and the pump beam intersect in the cell at an angle less than 5°.

19. An optical pumping magnetometer comprising:
a cell filled with a gas;
a laser source emitting a laser beam;
a polarization module adapted to linearly polarize the laser beam and to rotate a polarization such that the laser beam is polarized in a polarization direction;
a photodetector receiving the polarized laser beam after the polarized laser beam has passed through the cell and outputting an electrical signal;
first slaving means to keep a constant angle between the polarization direction and a magnetic field to be measured, wherein the first slaving means includes modulation means to modulate at least a first part of the laser beam so as to generate a pump beam modulated by a modulation frequency ($f_m$);
second slaving means to keep said modulation frequency equal to a Larmor frequency of the gas or one of a plurality of harmonics of the Larmor frequency, a value of the magnetic field to be measured being obtained from said modulation frequency; and
a frequency synthesizer that generates the modulation frequency ($f_m$), based on a measurement signal generated by the second slaving means, and sends the modulation frequency ($f_m$) as feedback to the modulation means,
wherein the modulation means make an intensity modulation at the Larmor frequency and at twice a frequency of the Larmor frequency,
the magnetometer comprises an optical separator on an input side of the polarization module to form a first part and a second part of the laser beam, the pump beam (P) being obtained by modulating the first part of the laser beam by said modulation means, the second part of the laser beam forming a probe beam (S) not modulated by said modulation means, the electrical signal resulting from conversion of the probe beam being input to the first and to the second slaving means, and
the probe beam and the pump beam are parallel and are separated by a distance less than a diffusion length of gas atoms in the cell.

* * * * *